United States Patent [19]
Belt

[11] 3,965,462
[45] June 22, 1976

[54] SERPENTINE CHARGE-COUPLED-DEVICE MEMORY CIRCUIT

[75] Inventor: Ronald A. Belt, Dayton, Ohio

[73] Assignee: The United States of America as represented by the Secretary of the Air Force, Washington, D.C.

[22] Filed: May 9, 1975

[21] Appl. No.: 576,059

[52] U.S. Cl. ............................ 340/173 R; 307/238; 357/24; 357/45
[51] Int. Cl.² .................. G11C 11/40; G11C 13/00
[58] Field of Search .................... 340/173 R, 173 C; 307/238; 357/24, 45

[56] References Cited
UNITED STATES PATENTS
3,891,977  6/1975  Amelio ............................ 340/173 R Primary Examiner—Terrell W. Fears
Attorney, Agent, or Firm—Joseph E. Rusz; Robert Kern Duncan

[57] ABSTRACT

In a charge-coupled-device the registers of two adjacent arrays are interleaved in a novel serpentine structure to provide a refresh-cell width of four times the width of a single-shift register.

2 Claims, 4 Drawing Figures

SERPENTINE CHARGE-COUPLED-DEVICE MEMORY CIRCUIT

RIGHTS OF THE GOVERNMENT

The invention described herein may be manufactured and used by or for the Government of the United States for all governmental purposes without the payment of any royalty.

BACKGROUND OF THE INVENTION

The field of the invention is in the arrangement of the signal paths in charge-coupled-devices.

In prior art devices difficulty has been encountered in providing reliable operation of the refresh-turn circuits coupling adjacent shift registers due to the extremely limited space available in which to position the necessary structure of the refresh-turn circuit which must redefine the signal-logic levels and simultaneously perform a 180° turn-around. The moderately simple and physically small refresh-turn circuits that can be positioned in the space available have been found to be unsatisfactory in that they are extremely sensitive to threshold voltage variations across the chip; and the more complicated refresh-turn circuits required for reliable operation are physically too large for the space available. There are numerous well known circuit designs available which will perform these functions of refresh-turn; however, practical considerations for integrating these larger space requirement circuits on the chip together with the CCD (charge-coupled-device) shift registers severely limits the possibility of their use. Such practical considerations include size, speed, power dissipation, number of clocking signals, bias voltages and compatibility with CCD processing. Of these, one of the most restrictive requirements is the size requirement. If more space were available, more complex circuits could be used and the other considerations taken care of. It is this problem of providing needed space that this invention solves by disclosing a novel structure that provides the space for the more complicated refresh-turn circuits that provides reliable and improved operation of the charge-coupled-device. Typical examples representative of the prior art in this field are U.S. Pat. Nos. 3,641,360 to patentee Y. L. Yao, 3,644,750 to patentee D. Campbell, 3,683,203 to patentee K. F. Smith, 3,764,824 to patentee F. L. J. Sangster, and 3,795,829 to patentee J. D. Wilcock.

SUMMARY OF THE INVENTION

An improved serpentine charge-coupled-device memory circuit is provided by alternately interleaving linear-shift registers of adjacent arrays, and placing non-refresh turn-around circuits in the CCD channel. This structure provides approximately twice the available space for the width of the refresh-turn circuitry over that of prior art devices so that better and more complex refresh-turn amplifiers and circuits may be used.

DESCRIPTION OF THE PREFERRED EMBODIMENT

Charge-coupled-device (CCD) memory circuits are conventionally organized in a number of ways, e.g., series-parallel-series, random access, line-addressable random access, and serpentine. If frequent refresh of the circuit is desired (for reasons of transfer efficiency and/or high-temperature reliability, for example), then the serpentine type of organization is usually preferred. This is particularly true for two-phase devices which are more easily adapted to a serpentine-type organization.

Figure 1:
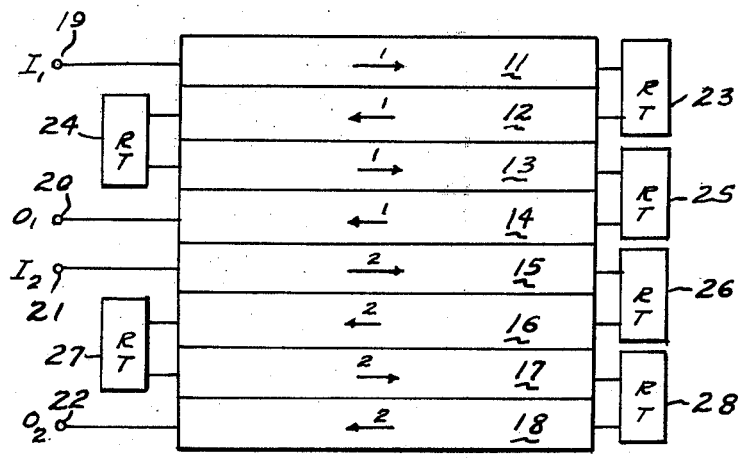
FIG. 1 is a schematic repesentation of a typical conventional prior art two-circuit serpentine CCD shift register memory device.

The serpentine-type memory organization is conventionally implemented as shown schematically in FIG. 1. It consists of a number of linear-shift registers (11 through 18) adjacent to one another which propagate information in alternate directions. The registers are N bits long, with N=64 or 128 being typical, and they are interconnected to form larger arrays. Each array is provided with an input and an output, and the entire array operates as a single-shift register of much longer length. In the typical prior art device schematically illustrated in FIG. 1, the upper array comprises the four shift registers 11, 12, 13 and 14 with input connection 19, output connection 20, and signal path 1 through the array. A second array is comprised of shift registers 15, 16, 17, and 18 with input connection 21, output connection 22, and signal path 2 through the array. Interconnections of the registers within an array are conventionally made by conventional refresh-turn circuits 23 through 28, which redefine the signal-logic levels and simultaneously perform a 180° turnaround. The space available dictates that moderately simple refresh-turn circuits 23 through 28 must be used and it is generally found that such circuits are extremely sensitive to threshold voltage variations across the chip and that it is difficult to obtain reliable operation. As FIG. 1 clearly illustrates, the conventional serpentine construction requires that the width of the refresh-turn circuits be less than, or approximately equal to, twice the width of a single-shift register. Since the shift registers are conventionally about 1 mil wide, the refresh-turn circuits cannot be over approximately two mils wide. Consequently, the refresh-turn circuit must be made long and narrow. When an attempt is made to interconnect various transistors to form the circuit, it becomes very difficult to arrange contact vias, metallization paths, component isolation, etc., within the narrow two-mil-wide area. The problem is mainly a topological one, and could be alleviated or minimized if the width requirement on the refresh-turn circuit could be relaxed because many well known refresh-turn circuits are available which will perform these functions of refresh-turn with the desired speed, power dissipation, number of clocking signals, bias voltages, compatability with CCD processing, are not unduly sensitive to threshold voltage variations, and provide overall reliable operation but they are physically too large to be utilized.

Figure 2:
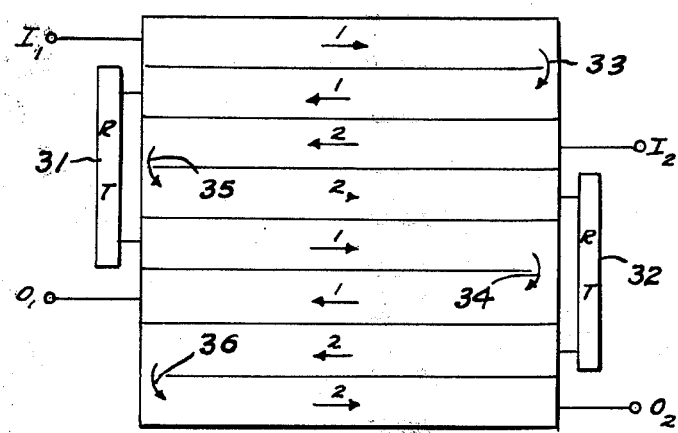
FIG. 2 is a schematic representation of an embodiment of the invention.
Figure 3:
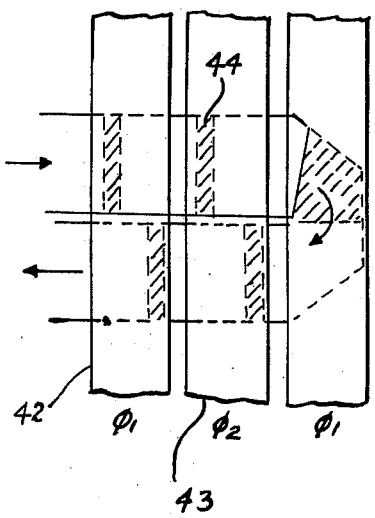
FIG. 3 is a schematic representation of a non-refresh turn-around circuit.
Figure 4:
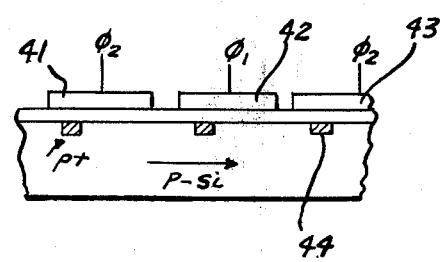
FIG. 4 is a schematic representation of a typical CCD channel.

An embodiment of the invention is schematically represented and shown in simplified form in FIG. 2. The CCD shift registers of two arrays are interleaved in a two-by-two relationship with non-refresh turn-arounds coupling adjacent registers of the same array and refresh-turn circuits coupling registers of the same array having interleaved registers of the other array. It has been found that by such interleaving of the registers of two adjacent arrays that twice the space width for each refresh-cell is available and that with the better refresh circuits that can be fitted in the larger space available an improvement in performance can be obtained with less than one-half the number of refresh-cells. Devices of this invention, such as represented by FIG. 2, with two arrays, each having four shift registers and but two refresh-turn circuits 31 and 32 (one for each array) are superior to and no larger than the prior art devices, illustrated by FIG. 1, having the same number of arrays and shift registers but having six refresh-turn circuits. Turn-arounds 33 and 34 in array one and turn-arounds 35 and 36 in array two do not refresh the signal, they merely provide a 180° phase reversal to phase-match the output of one shift register with the input of another. Such turn-around circuits without refresh are known. An example of a simple turn-around without refresh circuit that has been found to be suitable is fabricated by bending a linear-shift register 180° underneath a single gate as schematically illustrated in FIG. 3. In this circuit the charge carriers remain in the CCD channel. FIG. 4 illustrates a typical elevation view through a conventional CCD structure as used in the invention.

From FIG. 1 it can be seen that in the conventional prior art structures that the number of refresh-turn cells in an array are one less numerically than the number of shift registers in the array. In embodiments of the invention as represented by FIG. 2 it is readily seen that the number of turn-arounds required is one-half the number of shift registers and that the number of refresh-turn circuits is one less than the number of turn-arounds. This is the generally preferred construction of interleaving two arrays of an even number of shift registers.

Typical prior art CCD memory devices as represented by FIG. 1 typically have 128 bits per shift register and obviously that number of transfers to a refresh cell. Embodiments of the invention as represented by FIG. 2 typically have twice the number of transfers, i.e., 256 transfers, without refresh. Thus, the CCD shift registers used in the invention must have sufficiently high transfer efficiency for 256 transfers between refreshes, generally this is not a problem as it is common to have devices that provide over 500 transfers between refresh cells.

I claim:
1. A serpentine charge-coupled-device memory apparatus comprising:
   a. a first array comprising a plurality of an even number of CCD linear shift registers;
   b. a second array comprising a plurality of an even number of CCD linear shift registers interleaved with the said first plurality of shift registers in a two-by-two relationship;
   c. a turn-around circuit coupling each adjacent shift register of the same array; and
   d. a refresh-turn circuit coupling shift registers of the same array having interleaved registers of the other array.

2. The improvement in a serpentine two-array CCD linear shift register memory device, each of the said arrays having an even number of shift registers, numerically equal to or greater than four, the said improvement comprising:
   a. interleaving the said linear shift registers of the said two arrays in a two-by-two relationship;
   b. a turn-around circuit coupling adjacent registers of the same array; and
   c. a refresh-turn circuit coupling registers of the same array having interposed two registers of the other array.

* * * * *